(12) United States Patent
Jiang et al.

(10) Patent No.: US 7,910,292 B2
(45) Date of Patent: Mar. 22, 2011

(54) LITHOGRAPHIC PROCESS

(75) Inventors: Kyle Jiang, Birmingham (GB); Peng Jin, Harbin (CN)

(73) Assignee: American Compass, Inc., Pasadena, CA (US)

( * ) Notice: Subject to any disclaimer, the term of this patent is extended or adjusted under 35 U.S.C. 154(b) by 739 days.

(21) Appl. No.: 10/582,033

(22) PCT Filed: Dec. 1, 2004

(86) PCT No.: PCT/GB2004/005048
§ 371 (c)(1),
(2), (4) Date: Aug. 21, 2007

(87) PCT Pub. No.: WO2005/057289
PCT Pub. Date: Jun. 23, 2005

(65) Prior Publication Data
US 2008/0241735 A1    Oct. 2, 2008

(30) Foreign Application Priority Data
Dec. 11, 2003 (GB) .................................. 0328683.8

(51) Int. Cl.
*G03F 7/00* (2006.01)

(52) U.S. Cl. ..................... 430/330; 430/270.1; 430/296; 430/311

(58) Field of Classification Search ............... 430/270.1, 430/296, 330, 311
See application file for complete search history.

(56) References Cited

U.S. PATENT DOCUMENTS

| 4,882,245 A | 11/1989 | Gelorme et al. |
| 5,118,548 A * | 6/1992 | Ohkubo et al. ............. 428/65.1 |
| 6,716,568 B1 * | 4/2004 | Minsek et al. ............. 430/280.1 |
| 2002/0006588 A1 | 1/2002 | Afromowitz |
| 2002/0115016 A1 * | 8/2002 | Warren ......................... 430/259 |
| 2003/0138731 A1 | 7/2003 | Fang |
| 2004/0091820 A1 * | 5/2004 | Nagai et al. ................... 430/317 |

FOREIGN PATENT DOCUMENTS

| EP | 0385122 | 9/1990 |

OTHER PUBLICATIONS

Zhong-Geng Ling; Kun Lian; Linke Jian, "Improved patterning quality of SU-8 microstructures by optimizing the exposure parameters," Proc. of Spie; Advances in Resist Technology and Processing XVII, p. 1019-1027.
Conradie E H et al., "SU-8 thick photoresist processing as a functional material for MEMS applications," journal, Journal of Micromechanics & Microengineering (New York, NY), vol. 12 (No. 4), p. 368-374.

* cited by examiner

*Primary Examiner* — Thorl Chea
(74) *Attorney, Agent, or Firm* — Tim Tingkang Xia; Morris, Manning & Martin, LLP

(57) ABSTRACT

The present invention provides a lithographic process for producing high aspect ratio parts from an epoxy-type negative photoresist comprising the steps of: (i) irradiating a pre-baked masked epoxy-type negative photoresist on a substrate with light at a total energy density of from 18,000 to 35,000 mJ/cm$^2$, (ii) post-baking the exposed photoresist at elevated temperature, and (iii) developing the exposed photoresist in a solvent, wherein no more than 15% of the energy density is contributed by light having a wavelength of 400 nm or less. The invention also discloses a reciprocating microengine (10) comprising a cylinder (14), piston (12) and crankshaft made by the process.

11 Claims, 1 Drawing Sheet

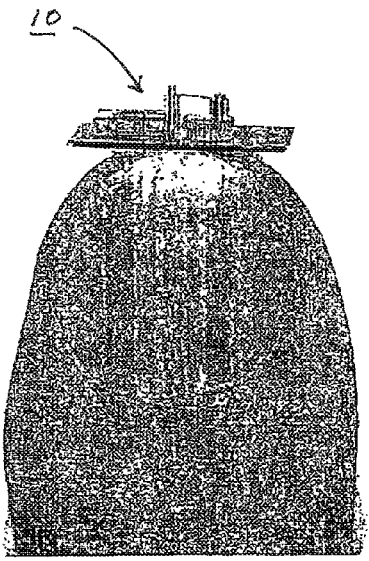
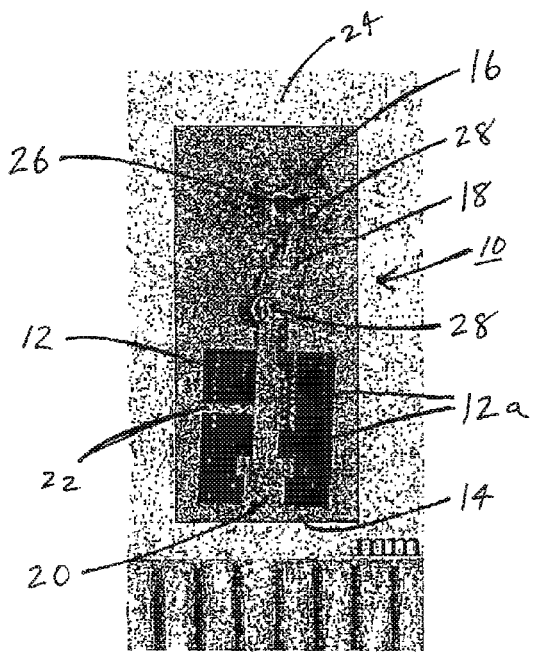
Figure 1
Figure 2
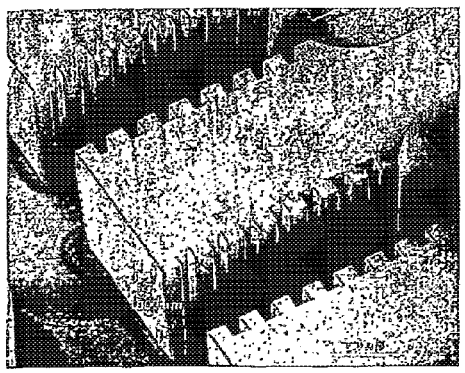
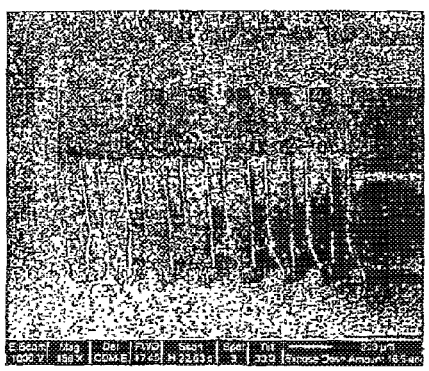
Figure 3
Figure 4
PRIOR ART

LITHOGRAPHIC PROCESS

The present invention relates to an improved lithographic process for the microfabrication of high aspect ratio articles from an epoxy-type negative photoresist and a reciprocating microengine whose major parts are fabricated using the process.

Currently, the most widely employed micro actuator is the electrostatic comb drive, which can be found in digital mirror display systems (R. M. Boysel et al, "Integration of deformable mirror devices with optical fibers and wave guides", Proc. SPIE, Vol. 1793, 34-39, 1992), and also in intricate safety locks for nuclear missiles I (Amato, "Fomenting a revolution, in miniature", Science, Vol. 282, 402-405, 16 Oct. 1998). More recently, micro rotary motors and indexing motors have been fabricated. The rotary motor can provide variable speed and torque in very small steps. These achievements mark big advances in MEMS technology (microelectromechanical systems). However, these actuators rely solely on electric power, which poses constraints to applications. For instance, electric powered micro unmanned air vehicles can not easily be developed due to their limited non-stop flying time. Microrobots and other free standing devices will face the same problems. Clearly, an alternative should be sought to electric powered devices. One possible solution is a micro combustion engine.

Since being developed by IBM (see for example U.S. Pat. No. 4,882,245), SU-8, the negative epoxy-type near UV photoresist has long been considered as a low cost material for microfabrication, and its excellent mechanical properties are particularly suitable in the MEMS field for high aspect ratio structure applications (A. Bertsch, et al, "Combining microsterolithography and thick resist UV lithography for 3D microfabrication", Proc. MEMS'98, IEEE, Heidelberg, 18-23, 1998). The design of a reciprocating combustion engine requires a strict vertical geometry and ultra-thickness on the piston and cylinder to prevent leakage. Conventional SU-8 processes often produce a trench with a wide top and narrow bottom profile, which is common for negative photoresists. The T-shape becomes more serious when the thickness of the SU-8 layer approaches 500 µm or more (Z. G Ling et al, "Improved patterning quality of SU-8 microstructures of optimizing the exposure parameters", Proc. SPIE, Vol. 3999, 1019, 1027, 2000). Many factors contribute to this dimensional change, such as the volume change of the SU-8 resist during polymerisation, chemical diffusion of crosslinking agents and several illumination parameters.

K. Jiang and P. Jin (Microfabrication of ultra-thick-SU-8 photoresist for microengines, Proc SPIE Photowest Micromachining and Microfabrication 2003, San Jose, Calif., 25-31 Jan. 2003) disclose the basic lithographic technique for the microfabrication of engine parts from ultrathick SU-8 (a well known epoxy-type negative photoresist). In particular Jiang discusses the relationship between aspect ratio and prebake parameters. However, Jiang does not disclose sufficient detail of the irradiation parameters to produce a high aspect ratio part.

It is an object of the present invention to provide an improved lithographic process for producing high aspect ratio parts from ultrathick epoxy-type negative photoresists.

According to a first aspect of the present invention there is provided a lithographic process for producing high aspect ratio parts from an epoxy-type negative photoresist comprising the steps of: —

(i) irradiating a prebaked masked epoxy-type negative photoresist on a substrate with light at a total energy density of from 18,000 to 35,000 mJ/cm$^2$, (ii) post-baking the exposed photoresist at elevated temperature, and (iii) developing the exposed photoresist in a solvent, wherein no more than 15% of the energy density is contributed by light having a wavelength of 400 nm or less.

It will be understood by the skilled person that irradiation of a negative photoresist causes exposed regions to become less soluble in the developing solvent, so the mask used in step (i) is an inverse image of the part to be produced.

Much to the surprise of the inventors, it was discovered that high aspect ratio structures could only be obtained by filtering out a portion of the light below 400 nm. This was unexpected since 365 nm light is generally recommended by SU-8 suppliers (the most commonly used epoxy-type negative photoresist) as the optimum wavelength for exposure, since this is the wavelength at which SU-8 is most sensitive to exposure. According to a second aspect of the invention there is provided a lithographic process for producing high aspect ratio parts from an epoxy-type negative photoresist comprising the steps of: —

(i) irradiating a prebaked masked epoxy-type negative photoresist on a substrate with a high pressure mercury lamp (ii) post-baking the exposed photoresist at elevated temperature, and (iii) developing the exposed photoresist in a solvent, wherein at least 20% of the UV light emitted from the mercury lamp having a wavelength of 365 nm is filtered out.

Preferably, the duration of exposure in step (i) in the second aspect is calculated so that the energy density of light at the unmasked surface of the photoresist is from 18,000 to 35,000 mJ/cm$^2$.

Preferably, at least 40% and more preferably at least 60% of the 365 nm light is filtered out.

Preferably, light below 400 nm contributes no more than 15% of the total energy density and more preferably no more than 10%.

Preferably, the photoresist is SU-8 (an octafunctional epoxidised novolac resin). More preferably the photoresist is 0.7 to 1.5 mm thick.

Step (i) may be a single irradiation step using an appropriate filter to filter out the desired proportion of 365 nm light (or light below 400 nm). Alternatively, step (i) may involve multiple exposures, each exposure filtering out a different proportion of 365 nm light (or light below 400 nm). For example, in one embodiment a four step exposure is adopted using a high pressure mercury lamp. In the first exposure no filter is used and in the last exposure all the 365 nm light is filtered. In the second and third exposures 80% and 90% of the 365 nm light is filtered respectively. Clearly, the duration of each exposure is calculated according to the amount of 365 nm filtered in each exposure and the required level of exposure in total and at 365 nm.

Preferably step (ii) is carried out at a temperature of at least 60° C. Preferably, the duration of step (ii), is at least 30 minutes. In a preferred embodiment, the post bake is a two step procedure in which the photoresist is heated to a first temperature (e.g. about 60 to 70° C. for about 15 minutes) and subsequently to a second higher temperature (e.g. about 90 to 100° C. for about 20 minutes).

Clearly, step (iii) requires use of a solvent in which the unexposed photoresist is soluble. In the case of SU-8, suitable solvents include EC solvent and propylene glycol methyl ether acetate (PGMEA), ethyl lactate and diacetone alcohol.

Preferably, the method includes a step of rinsing the developed photoresist after step (iii) followed by drying.

The method preferably comprises a final step of removing the developed photoresist from the substrate.

Suitable pre-bake conditions are disclosed in Jiang (supra).

The above method is suitable for fabricating parts having a depth of 1 mm or more with an aspect ratio of 10:1 or greater, and even 40:1 or greater The invention also relates to a part fabricated using the above process and to a reciprocating microengine comprising a cylinder, piston and crankshaft, one or more of which are fabricated by the above method.

The invention will now be described by way of example only, with reference to the accompanying drawings, in which:

FIG. 1 is a microengine fabricated in accordance with the process of the present invention on a finger tip, FIG. 2 is top view of the engine shown in FIG. 1, FIG. 3 is a photograph of a micro piston produced by the process of the present invention, and FIG. 4 is a photograph of a micro piston produced by a comparative process.

Referring to FIGS. 1 and 2, a microengine 10 is based on the mechanism of a two-stroke reciprocating engine and comprises a piston 12 housed in a piston cylinder 14, the piston 12 being connected to a gear wheel 16 by a connecting rod 18. The base of the cylinder 14 is provided with an inlet port 20 for fuel and the side of the cylinder 14 is provided with an exhaust port 22. One of the cylinder walls is defined by a rectangular block 24 which extends above the cylinder 14 and is provided with a pin 26 on the extension which serves as a mounting point for the gear wheel 16. Pins 28 are also provided at each end of the connecting rod 18, at the top of the piston 12 and on the gear wheel 16 to enable assembly of the various parts. Taking into account the nature of the lithographic process, the engine 10 is designed in 2D shapes. Thus, the piston 12 has a square cross section. The contact surfaces of the piston 12 with the cylinder 14 are much larger than would be the case in a conventional engine, and fine grooves 12a are made on the surfaces of the piston 12 at its lower end for prevention of gas leakage. The cylinder 14 is a large trench of square cross section, to be covered by a glass (not shown). A synchronization valve (not shown) is located at the bottom of the cylinder 14, which is triggered open to release liquid $CO_2$ the fuel for the engine. The expansion ratio of liquid $CO_2$ is 10, which is smaller than that of combustive fuels. The exhaust port 22 of the engine 10 is made as a groove of square cross section through the wall of the cylinder 14.

With the exception of the pins 26, 28, all the engine parts are made from SU-8 photoresist. The cross section of the piston 12 is 1×1 mm and the sidewalls of the cylinder 14 are 1 mm thick.

In use, liquid $CO_2$ is inducted into the cylinder 14 through the inlet port 20 when the piston 12 is at the bottom of the cylinder 14. The inducted $CO_2$ then vaporises and expands to push the piston 12 up until the exhaust port 22 is exposed. Gaseous "exhaust" $CO_2$ leaves the engine through the exhaust port 22. As the piston 12 moves it rotates the gear wheel 16 via the connecting rod 18. The gear wheel 16 serves as a crankshaft, a flywheel and a driving device to transmit power from the engine 10 to external devices (not shown). After the expansive force of the $CO_2$ is spent, the gear wheel 16 and the driven external devices provide a momentum to push the piston 12 back to the bottom of the cylinder 14 to trigger the $CO_2$ valve, and another cycle starts. The designed power output of the $CO_2$ engine 10 is 2.56 mW, at a speed of 1000 rpm.

The majority of components in the micro reciprocating engine 10, such as the piston 12, the cylinder 14, the connecting-rod 18 and the gear wheel 16, are subject to loading. Deformation of cylinder walls may increase leakage dramatically, and excessive stress on a part will break it. Finite element analysis has been used for predicting the dynamic stress and deformation of the piston 12, cylinder 14 and connecting rod 18. The maximum stress occurring in the piston 12 for a working cycle is 22.19 Mpa, which is far below the fracture stress of 34 Mpa for SU-8 (H. Lorenz et al "Mechanical characterization of a new high-aspect-ratio near UV-photoresist", Microelec, Engin. 41/42, 371-374, 1998). The amount of deformation on the cylinder 14 is $1.56\times10^{-6}$ mm, which can be ignored. The maximum deformation occurs on the piston 12, and the value is $9.50\times10^{-3}$. Such a deformation on the piston 12 will not affect the performance of the piston.

Fabrication Example

1. Coating 12 ml of SU-8-50 photoresist (Microchem, MA) was cast onto a 10 cm square silicon wafer which was placed on a flat surface to allow the SU-8-50 to spread evenly. The resultant layer was about 1000 μm thick.

2. Prebake

The coated wafer was soft baked on a level hot plate for 2 hours at 65° C. and then at a temperature of 95° C. for 30 hours. After this time the heat was removed and the wafer allowed to cool to room temperature (1 to 2 hours).

3. Exposure

The pre-baked SU-8 coating was exposed to UV light from a USHIO 250 W super high pressure mercury lamp providing a combination of useable wavelengths including g-line (436 nm), h-line (405 nm) and i-line (365 nm). Exposure was carried out in 4 steps: —

(i) without filter to deliver 1512 ml/cm$^2$
(ii) with UC-20[1] filter to deliver 2268 mJ/cm$^2$
(iii) with UC-10[2] filter to deliver 3780 mJ/cm$^2$
(iv) with L-39[3] filter to deliver 17010 mJ/cm$^2$

[1] filters 80% of light at 365 nm
[2] filters 90% of light at 365 nm
[3] filters 100% of light at 365 nm It will be appreciated that the actual duration of exposure required will vary from lamp to lamp.

4. Postbake

The exposed wafer was baked at 65° C. for 15 minutes and subsequently at 95° C. for 25 minutes and then allowed to cool to room temperature.

5. Development

The wafer was placed into a bath of EC solvent which was magnetically stirred for 1 hour. The solvent was replaced with fresh solvent and stirring continued for a further 15 minutes. The wafer was rinsed with acetone and then ethanol and dried in a stream of nitrogen gas.

The microstructures were then obtained by etching off the silicon wafer in a conventional manner.

FIG. 3 is a photograph of a mircopiston produced according to the above fabrication example. The piston has clear groove profiles and meets all the geometric requirements for use in applications such as a reciprocating microengine.

Comparative Fabrication Example

The fabrication example was repeated exactly as described above except that irradiation was carried out in a single step to deliver the same total energy, but with no filtration of the 365 nm light (i.e. in accordance with the Jiang reference). The results for a micropiston are shown in FIG. 4. Although the top of the grooves show good definition there is clear tapering and general non-linearity from about two thirds of the way from the surface to the base (using the UV exposed surface as reference).

The invention claimed is:

1. A lithographic process for producing a microstructure from an SU-8 photoresist, wherein the SU-8 photoresist has a thickness in a range of 1.0 mm to 1.5 mm, comprising the steps of:
   (i) exposing a prebaked SU-8 photoresist on a substrate to light at a total energy density in a range of 18,000 to 35,000 mJ/cm$^2$, wherein the light comprises a combination of wavelengths including g-line (436 nm), h-line (405 nm), and i-line (365 nm), and wherein the exposing further comprises:
      (a) exposing the SU-8 photoresist to the light without a filter;
      (b) exposing the SU-8 photoresist to the light with a first filter that filters out 80% of the light at 365 nm;
      (c) exposing the SU-8 photoresist to the light with a second filter that filters out 90% of the light at 365 nm; and
      (d) exposing the SU-8 photoresist to the light with a third filter that filters out all of the light at 365 nm;
   (ii) post-baking the SU-8 photoresist at a temperature of at least 60° C.; and
   (iii) developing the SU-8 photoresist in a solvent, whereby the microstructure is produced.

2. A process as claimed in claim 1, wherein the SU-8 photoresist is an octafunctional epoxidised novolac resin.

3. A process as claimed in claim 1, wherein the post-baking step comprises a two step procedure in which the photoresist is heated to a first temperature that is in a range of 60° C. to 70° C. and subsequently to a second temperature that is in a range of 90° C. to 100° C.

4. A process as claimed in claim 1, wherein the method includes a step of rinsing the developed photoresist after step (iii) followed by drying.

5. A process as claimed in claim 1, wherein the step of (a) exposing the SU-8 photoresist to the light without a filter further comprises delivering 1512 mJ/cm$^2$ to the photoresist.

6. A process as claimed in claim 1, wherein the step of (b) exposing the SU-8 photoresist to the light with a first filter that filters out 80% of the light at 365 nm further comprises delivering 2268 mJ/cm$^2$ to the photoresist.

7. A process as claimed in claim 1, wherein the step of (c) exposing the SU-8 photoresist to the light with a second filter that filters out 90% of the light at 365 nm further comprises delivering 3780 mJ/cm$^2$ to the photoresist.

8. A process as claimed in claim 1, wherein the step of (d) exposing the SU-8 photoresist to the light with a third filter that filters out all of the light at 365 nm further comprises delivering 17010 mJ/cm$^2$ to the photoresist.

9. A process as claimed in claim 1, wherein the light is UV light emitted from a high pressure mercury lamp.

10. A microstructure fabricated using the process of claim 1.

11. A microstructure as claimed in claim 10, wherein the microstructure produced by the process comprises an aspect ratio of greater than or equal to 40:1.

* * * * *